United States Patent
Chen et al.

(10) Patent No.: US 12,154,864 B2
(45) Date of Patent: Nov. 26, 2024

(54) III-NITRIDE-BASED SEMICONDUCTOR DEVICES ON PATTERNED SUBSTRATES AND METHOD OF MAKING THE SAME

(71) Applicant: INNOSCIENCE (SUZHOU) TECHNOLOGY CO., LTD., Suzhou (CN)

(72) Inventors: Liang Chen, Suzhou (CN); Hao Li, Suzhou (CN); Haoning Zheng, Suzhou (CN); King Yuen Wong, Suzhou (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 809 days.

(21) Appl. No.: 17/289,250

(22) PCT Filed: Mar. 30, 2021

(86) PCT No.: PCT/CN2021/083831
§ 371 (c)(1),
(2) Date: Apr. 28, 2021

(87) PCT Pub. No.: WO2022/204913
PCT Pub. Date: Oct. 6, 2022

(65) Prior Publication Data
US 2022/0375874 A1    Nov. 24, 2022

(51) Int. Cl.
*H01L 23/00* (2006.01)
*H01L 21/02* (2006.01)
(Continued)

(52) U.S. Cl.
CPC ...... *H01L 23/562* (2013.01); *H01L 21/02381* (2013.01); *H01L 21/0243* (2013.01);
(Continued)

(58) Field of Classification Search
CPC ............ H01L 23/562; H01L 21/02381; H01L 21/0243; H01L 21/02458; H01L 21/02488;
(Continued)

(56) References Cited

U.S. PATENT DOCUMENTS 3,748,545 A * 7/1973 Beale ............... H01L 21/74
257/652
8,030,666 B2 * 10/2011 Chen ............... H01L 21/02381
257/E33.025
(Continued)

FOREIGN PATENT DOCUMENTS

CN    101232067 A    7/2008
CN    101378017 A    3/2009
(Continued)

OTHER PUBLICATIONS

Keming Jiang, "Study of Antireflective Subwavelength Optical Elements based on Nanoimprint Lithography", Soochow University, 2013.
(Continued)

*Primary Examiner* — Caleb E Henry
(74) *Attorney, Agent, or Firm* — JCIPRNET

(57) ABSTRACT

A III-nitride-based semiconductor device is provided. The III-nitride semiconductor device includes a silicon substrate having a surface with a periodic array of recesses formed therein. A discontinuous insulating layer is formed within each recess of the periodic array of recesses such that a portion of the silicon substrate surface between adjacent recesses is free from coverage of the discontinuous insulating layer. A first epitaxial III-nitride semiconductor layer is formed over the silicon substrate with the periodic array of recesses and discontinuous insulating layer formed thereon. A second III-nitride semiconductor layer is disposed over the first III-nitride semiconductor layer and has a bandgap
(Continued)

greater than a bandgap of the first III-nitride semiconductor layer. At least one source and at least one drain are disposed over the second III-nitride semiconductor layer. A gate is also disposed over the second III-nitride semiconductor layer between the source and the drain.

17 Claims, 11 Drawing Sheets

(51) Int. Cl.
 *H01L 29/20* (2006.01)
 *H01L 29/205* (2006.01)
 *H01L 29/66* (2006.01)
 *H01L 29/778* (2006.01)

(52) U.S. Cl.
 CPC .. *H01L 21/02458* (2013.01); *H01L 21/02488* (2013.01); *H01L 21/0254* (2013.01); *H01L 29/2003* (2013.01); *H01L 29/205* (2013.01); *H01L 29/66462* (2013.01); *H01L 29/7786* (2013.01)

(58) Field of Classification Search
 CPC ............ H01L 21/0254; H01L 29/2003; H01L 29/205; H01L 29/66462; H01L 29/7786; H01L 21/02002; H01L 21/02502; H01L 21/02573; H01L 21/0262; H01L 21/0331; H01L 21/3086; H01L 21/02639; H01L 21/02647; H01L 29/0649; H01L 29/1066; H01L 29/7787; H01L 29/0657; H01L 29/0684
 See application file for complete search history.

(56) References Cited

U.S. PATENT DOCUMENTS

| | | | | |
|---|---|---|---|---|
| 8,772,831 B2* | 7/2014 | Chen | ................. | H01L 21/0254 |
| | | | | 257/191 |
| 8,809,909 B2* | 8/2014 | Briere | ................. | H01L 29/7786 |
| | | | | 257/E29.249 |
| 8,815,715 B2* | 8/2014 | Herman | ................. | H01L 21/78 |
| | | | | 438/758 |
| 9,233,844 B2* | 1/2016 | Chen | ................. | B82Y 10/00 |
| 9,608,160 B1* | 3/2017 | Bayram | ................. | H01S 5/34333 |
| 9,698,365 B2* | 7/2017 | Seo | ................. | H10K 50/11 |
| 9,935,175 B1* | 4/2018 | Lee | ................. | H01L 21/02458 |
| 10,153,362 B2* | 12/2018 | Curatola | ................. | H01L 29/1066 |
| 2002/0074935 A1* | 6/2002 | Kwong | ................. | H10K 50/12 |
| | | | | 313/504 |
| 2002/0086180 A1* | 7/2002 | Seo | ................. | H10K 50/11 |
| | | | | 428/917 |
| 2005/0077512 A1* | 4/2005 | Yoon | ................. | H01L 33/007 |
| | | | | 257/E21.127 |
| 2006/0118819 A1* | 6/2006 | Hanson | ................. | H01L 29/7787 |
| | | | | 257/E29.081 |
| 2006/0194077 A1* | 8/2006 | Noguchi | ................. | H10K 50/11 |
| | | | | 428/917 |
| 2006/0251919 A1* | 11/2006 | Aziz | ................. | H10K 50/11 |
| | | | | 313/506 |
| 2008/0135804 A1* | 6/2008 | Qiu | ................. | H05B 33/14 |
| | | | | 252/301.16 |
| 2010/0096668 A1* | 4/2010 | Briere | ................. | H01L 21/8258 |
| | | | | 257/E29.246 |
| 2010/0243991 A1* | 9/2010 | Nauka | ................. | C09K 11/02 |
| | | | | 257/E51.026 |
| 2010/0244673 A1* | 9/2010 | Nomura | ................. | H05B 33/14 |
| | | | | 313/504 |
| 2011/0284868 A1* | 11/2011 | Briere | ................. | H01L 29/7787 |
| | | | | 257/E29.091 |
| 2013/0078783 A1* | 3/2013 | Nieh | ................. | H01L 21/76224 |
| | | | | 257/E21.546 |
| 2013/0112990 A1* | 5/2013 | Weeks, Jr. | ................. | C30B 25/18 |
| | | | | 257/76 |
| 2014/0014967 A1* | 1/2014 | Chen | ................. | H01L 21/02488 |
| | | | | 257/E29.081 |
| 2016/0202532 A1 | 7/2016 | Hwang | | |
| 2017/0069713 A1 | 3/2017 | Roberts et al. | | |
| 2017/0170283 A1* | 6/2017 | Laboutin | ........... | H01L 21/02458 |
| 2017/0330808 A1* | 11/2017 | Heider | ................. | G01B 11/24 |
| 2018/0040505 A1* | 2/2018 | Gaan | ................. | H01L 21/76283 |
| 2019/0198796 A1* | 6/2019 | Kim | ................. | H10K 50/15 |
| 2020/0395447 A1 | 12/2020 | Brech et al. | | |
| 2021/0384345 A1* | 12/2021 | Chen | ................. | H01L 29/2003 |
| 2022/0375874 A1* | 11/2022 | Chen | ................. | H01L 29/205 |

FOREIGN PATENT DOCUMENTS

| | | |
|---|---|---|
| CN | 102544273 A | 7/2012 |
| CN | 103021804 A | 4/2013 |
| CN | 103066106 A | 4/2013 |
| CN | 103531615 A | 1/2014 |
| CN | 104465743 A | 3/2015 |
| CN | 106233429 A | 12/2016 |
| CN | 108447788 A | 8/2018 |
| CN | 108682656 A | 10/2018 |
| CN | 112103335 A | 12/2020 |
| CN | 112236844 A | 1/2021 |

OTHER PUBLICATIONS

Second Office Action of corresponding China patent application No. 202180002254.5 mailed on Sep. 22, 2022.

International Search Report and Written Opinion of the corresponding PCT application No. PCT/CN2021/083831 mailed on Dec. 30, 2021.

First Office Action of the corresponding China patent application No. 202180002254.5 mailed on Jul. 1, 2022.

* cited by examiner

III-NITRIDE-BASED SEMICONDUCTOR DEVICES ON PATTERNED SUBSTRATES AND METHOD OF MAKING THE SAME

FIELD OF THE INVENTION

The present invention generally relates to III-nitride-based semiconductor devices, and more particularly, to improved III-nitride layers formed on substrates with periodic arrays of recesses filled with insulator layers.

BACKGROUND OF THE INVENTION

In recent years, research and development has focused on III nitride-based semiconductor materials for use in a variety of III nitride-based devices. III nitride-based devices include heterostructure-including devices, light emitting diodes (LEDs), and lasers. Examples of devices having heterostructures include heterojunction bipolar transistors (HBT), heterojunction field effect transistors (HFET), high-electron-mobility transistors (HEMT), or modulation-doped FETs (MODFET). As used herein, the term "III-nitride" means GaN, AlN, InN and various mixtures thereof such as AlGaN, InAlGaN and InAlN with various ratios of metal elements in the nitrides. Many III-nitride devices are used in high frequency RF and/or high power applications as III-nitride devices can operate at higher power and higher frequencies than silicon or GaAs devices.

Substrate loss is an important factor for RF devices. Substrate loss has a direct impact on the linearity of switches and the linearity of power amplifiers. Increasing the effective resistivity of substrate is a valid method to reduce the substrate loss and improve device performance. In order to produce low cost III-nitride devices on a commercial scale, it is desirable to form III nitride layers on low cost semiconductor substrates such as silicon. However, a parasitic channel exists at the epitaxial nitride-silicon interface, and the parasitic channel of substrate is the main factor that reduces the effective resistivity of substrate.

Thus, there is a need in in the art for improved silicon substrates for III-nitride based devices, and particularly for improved silicon substrates that reduce the effect of the parasitic channel between a III-nitride layer and the silicon substrate.

SUMMARY OF THE INVENTION

In accordance with one aspect of the present disclosure, a III-nitride-based semiconductor device is provided. The III-nitride semiconductor device includes a silicon substrate having a surface with a periodic array of recesses formed in the surface of the silicon substrate. A discontinuous insulating layer is formed within each recess of the periodic array of recesses such that a portion of the silicon substrate surface between adjacent recesses is free from coverage of the discontinuous insulating layer. A first epitaxial III-nitride semiconductor layer is formed over the silicon substrate with the periodic array of recesses and discontinuous insulating layer formed thereon. A second III-nitride semiconductor layer is disposed over the first nitride semiconductor layer and has a bandgap greater than a bandgap of the first nitride semiconductor layer. At least one source and at least one drain are disposed over the second III-nitride semiconductor layer. A gate is also disposed over the second III-nitride semiconductor layer and between the source and the drain.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

Embodiments of the invention are described in more detail hereinafter with reference to the drawings, in which.

DETAILED DESCRIPTION

Figure 1A:
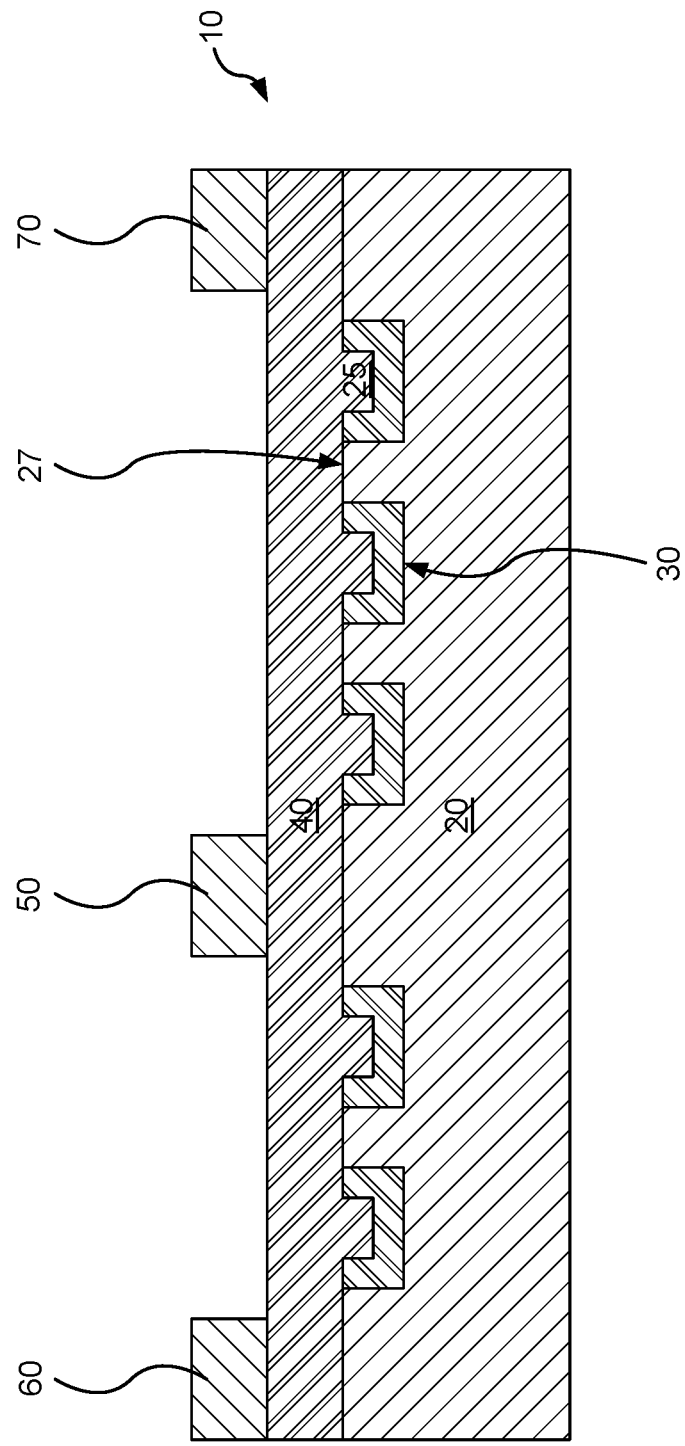
FIGS. 1A-1B are cross-sectional and perspective views, respectively, of an III-nitride semiconductor device formed according to an embodiment.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

In the following description, semiconductor devices, methods for manufacturing the same, and the likes are set forth as preferred examples. It will be apparent to those skilled in the art that modifications, including additions and/or substitutions may be made without departing from the scope and spirit of the invention. Specific details may be omitted so as not to obscure the invention; however, the disclosure is written to enable one skilled in the art to practice the teachings herein without undue experimentation.

The present invention provides improved III-nitride semiconductor devices formed on substrates having periodic recesses with a discontinuous insulating layer formed thereon such that a portion of the silicon substrate surface between adjacent recesses is free from coverage of the discontinuous insulating layer. A first epitaxial III-nitride semiconductor layer is formed over the silicon substrate with the periodic array of recesses and discontinuous insulating layer formed thereon. A second III-nitride semiconductor layer is disposed over the first nitride semiconductor layer and has a bandgap greater than a bandgap of the first nitride semiconductor layer. At least one source and at least one drain are disposed over the second III-nitride semiconductor layer. A gate is also disposed over the second III-nitride semiconductor layer and between the source and the drain.

Figure 1B:
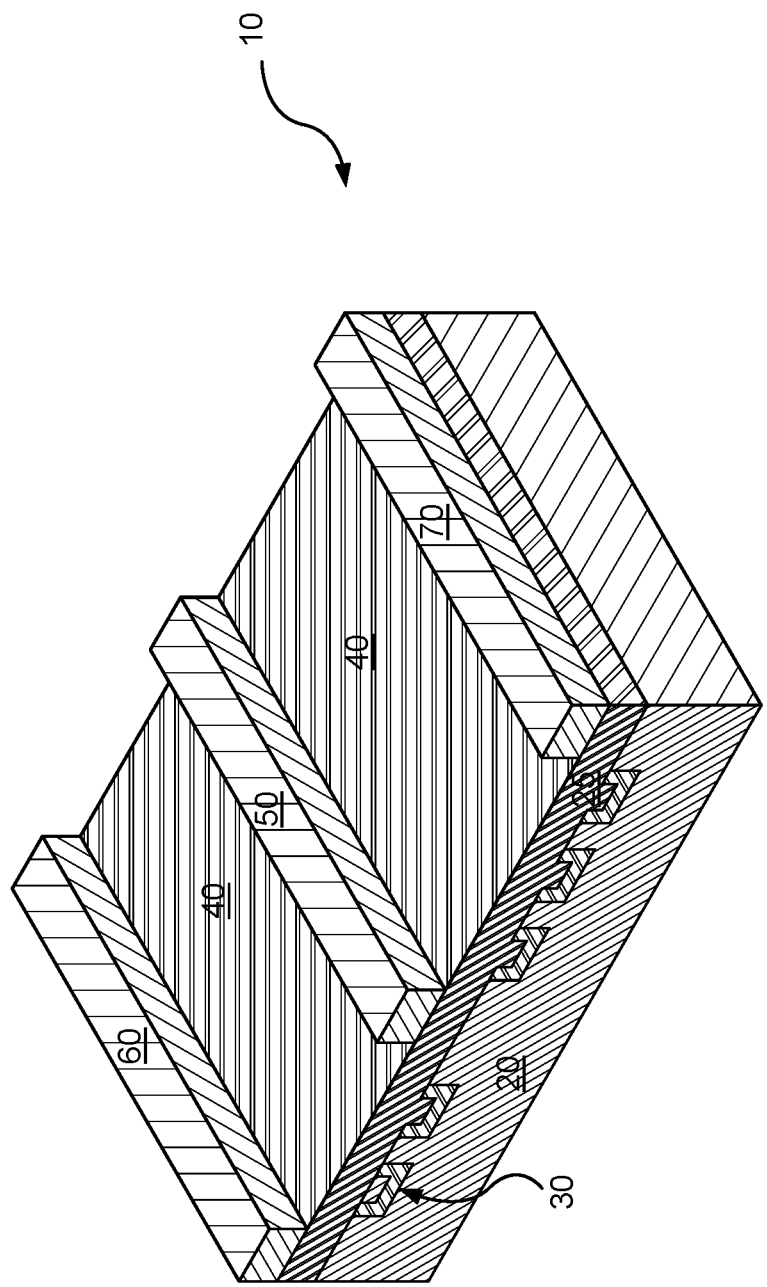

Turning to FIGS. 1A-1B, a III-nitride semiconductor device 10 is depicted. III-nitride semiconductor device 10 includes a silicon substrate 20 having a periodic array of recesses 25 formed in a top surface. The recesses may have a variety of cross-sectional shapes (to be discussed in further detail below) depending on upon the selected etchant composition and/or etching technique. In one aspect, the recesses 25 may have an approximate depth of approximately 300 nm to 1 micron, more particularly, approximately 400 nm to approximately 600 nm. A discontinuous layer of an insulator 30 is formed such that the insulator layer 30 is formed within each recess but does not cover periodic surface portions 27 of the silicon wafer positioned in between adjacent recesses. The insulator layer 30 may be selected from a silicon dioxide or $SiO_x$ layer, or a silicon nitride or $SiN_x$, layer, silicon oxynitride, and other oxides, nitrides, or oxynitrides.

An epitaxial III-nitride semiconductor layer 40 is formed on or over the silicon substrate with recesses filled with the insulator 30. The epitaxial layer may be partially formed within the recesses 25, over the insulator layer. In other embodiments, the insulator layer 30 may entirely fill each recess 25 such that the epitaxial layer is substantially planar rather than having an irregular base structure as shown in FIGS. 1A-1B. As used herein, the term "III-nitride" semiconductor means GaN, AlN, InN and various mixtures thereof such as AlGaN, InAlGaN and InAlN with various ratios of metal elements in the nitrides. The composition of the III-nitride layer 40 may be one or more of GaN, AlN, InN, $In_xAl_yGa_{(1-x-y)}N$ where $x+y\leq 1$, $Al_yGa_{(1-y)}N$ where $y\leq 1$.

The III-nitride layer may be deposited by, for example, high temperature chemical vapor deposition or plasma-enhanced chemical vapor deposition. To deposit III-nitride films, a nitrogen source such as nitrogen, ammonia, or other nitrogen-containing gases is provided along with one or more Group III sources such as indium, gallium, or aluminum. Exemplary Group III sources include organometallic gases such as trimethyl indium, trimethyl gallium, or trimethyl aluminum. Optionally, carrier gases such as hydrogen or nitrogen may be provided for the organometallic gases. Depending upon the selected reactants, an organometallic gas may decompose upon being heated into an intermediate produce. This intermediate product will react with the nitrogen source gas (such as ammonia) and form a III-nitride layer on the substrate. Additional gases may be added for dopants that are introduced during the film formation process (e.g., sources for dopants such as magnesium, iron, silicon, fluorine, etc.).

In one particular embodiment, layer 40 includes plural sub-layers with a first III-nitride semiconductor layer formed over the substrate 20 and a second III-nitride semiconductor layer formed over the first III-nitride layer and having a bandgap larger than the first III-nitride layer such that a heterojunction is formed between the first and second III-nitride semiconductor sub-layers. For example, the first semiconductor sub-layer may be an undoped GaN layer having bandgap of approximately 3.4 eV, while the second semiconductor sub-layer may be an AlGaN layer having bandgap of approximately 4.0 eV. As such, the semiconductor sub-layers as a channel layer and a barrier layer, respectively. A triangular well potential is generated at an interface between the channel and barrier layers, so that electrons accumulate in the triangular well potential, thereby generating a two-dimensional electron gas (2DEG) region at the same interface. Accordingly, the semiconductor device 10 can serve as a high-electron-mobility transistor (HEMT).

In one embodiment, a buffer layer, transition layer, seed layer or other layer (not shown in FIGS. 1A-1B) may be formed between the silicon substrate 20/insulating layer 30 and the III-nitride epitaxial layer(s) 40. This optional layer may be one or more of nitrides or group III-V compounds, such as GaN, GaAs, InN, AlN, InGaN, AlGaN, InAlGaN, or combinations thereof. Further, various transitional structures such as superlattices of AlN/GaN and AlGaN/GaN may be used.

When the semiconductor device to be formed is a high-electron-mobility transistor (HEMT) as depicted in FIGS. 1A-1B, at least three electrodes are formed over the epitaxial III-nitride layer(s) 40. These are one or more source electrodes 60, one or more gate electrode 50, and one or more drain electrodes 70. Although FIG. 1A schematically depicts these electrodes as single layer structures, they may be plural layers having the same or different compositions. Exemplary materials of the gate, source, and drain electrodes may be metals or metal compounds including, but not limited to W, Au, Pd, Ti, Ta, Co, Ni, Pt, Mo, TiN, TaN, other metallic compounds, nitrides, oxides, silicides, doped semiconductors, metal alloys, or combinations thereof. An optional dielectric structure can be positioned between the gate electrode 50 and the epitaxial layer(s) 40. The dielectric may, for example, be one or more oxide layers, a $SiO_x$ layer, a $SiN_x$ layer, a high-k dielectric material (e.g., $HfO_2$, $Al_2O_3$, $TiO_2$, HfZrO, $Ta_2O_3$, $HfSiO_4$, $ZrO_2$, $ZrSiO_2$, etc.), or combinations thereof.

In one embodiment, the semiconductor device 10 may be an enhancement mode device, which is in a normally-off state when the gate electrode 50 is at approximately zero bias. In such an embodiment, one or more p-type doped III-nitride semiconductor layers are positioned between the gate electrode and the III-nitride semiconductor layer(s) 40. The use of a p-doped III-nitride layer creates a p-n junction with the III-nitride semiconductor layer(s) 40 to deplete a 2DEG region, such that a zone of the 2DEG region corresponding to a position below the gate electrode 50 has different characteristics (e.g., different electron concentrations) than the rest of the 2DEG region and thus is blocked.

Due to this mechanism, the semiconductor device has a normally-off characteristic. In other words, when no voltage is applied to the gate 50 or a voltage applied to the gate 50 is less than a threshold voltage (i.e., a minimum voltage required to form an inversion layer below the gate 50), the zone of the 2DEG region below the gate 50 is kept blocked, and thus no current flows there through. Moreover, by providing a p-type doped III-nitride semiconductor, gate leakage current is reduced and an increase in the threshold voltage during the off-state is achieved.

The exemplary material of the optional p-type doped III-nitride layer can include, for example but is not limited to, p-doped group III-nitride semiconductor materials, such as p-type GaN, p-type AlGaN, p-type InN, p-type AlInN, p-type InGaN, p-type AlInGaN, or combinations thereof. In some embodiments, the p-doped materials are achieved by using a p-type impurity, such as Be, Mg, Zn, Cd.

Alternatively, the gate electrode 50 may be deposited directly on the semiconductor layer(s) 40 (as shown in FIGS. 1A and 1B), resulting in a normally-on device.

Further details of the device 10 that may be formed on the substrates of the present invention is described in commonly-assigned U.S. Pat. No. 10,833,159, the disclosure of which is incorporated by reference herein. Numerous other III-nitride devices may also be formed on the insulator-coated recess-containing patterned silicon substrates as described in the Background section.

Turning to FIGS. 2A-2F, an exemplary technique is depicted for forming the insulator-coated recesses 25 of the patterned substrate of FIGS. 1A-1B. However, it is understood that many other techniques may be used to form recesses in a silicon substrate (such as conventional photolithography) and, as such, any technique to form the periodic array of recesses coated with an insulator may be used in the semiconductor devices of the present invention.

Figure 2A:
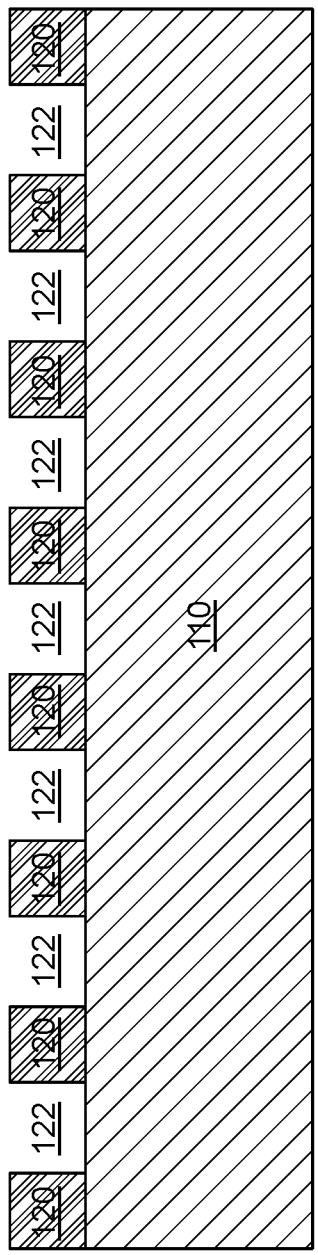
FIGS. 2A-2F are cross-sectional views of a silicon substrate preparation process for the semiconductor device of FIGS. 1A-1B according to some embodiments of the present disclosure.

In FIG. 2A, UV nanoimprinting lithography is used to define a structural pattern of columns and recesses in a photoresist layer 120 on a silicon substrate 110 with each recess having a width of approximately 200-600 nm with 400 nm being an example, and an inter-recess spacing of approximately 800 nm to 1.2 microns with 1 micron being an example. In UV nano-imprinting lithography, a pattern is made by physical contact of a patterned mold with a resist, deforming the resist to form a desired pattern, followed by ultraviolet curing of the resist. Other types of nanoimprinting techniques may also be used such as thermoplastic nanoimprint lithography. The patterning leaves a series of recesses 120 between the adjacent columns of resist.

Figure 2B:
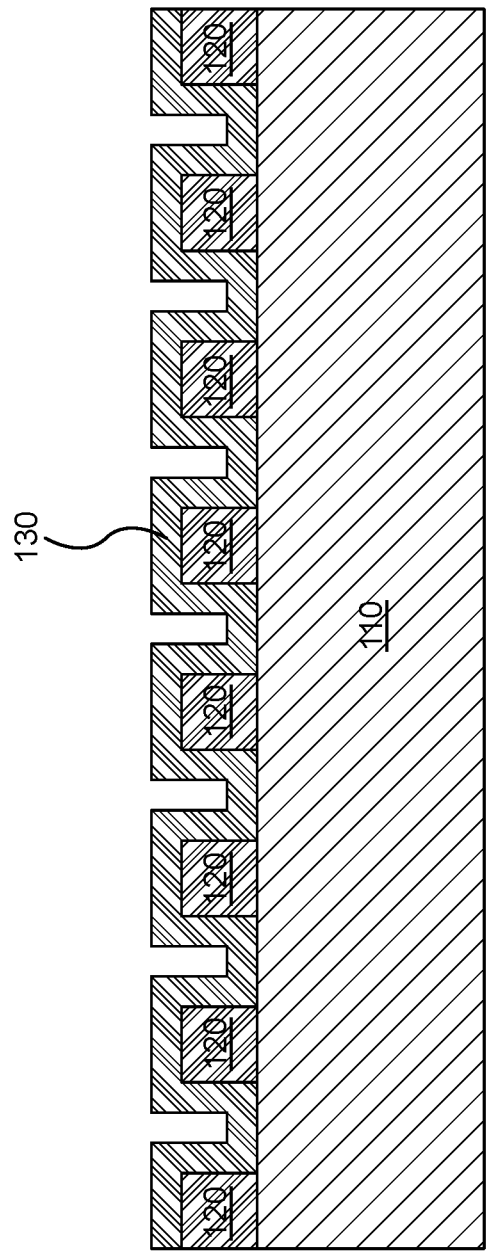

In FIG. 2B, a thin nickel (or other metal) layer 130 is deposited over the cured resist pattern 120 and into recesses 122. The thin nickel layer has thickness of approximately 40-90 nm with 70 nm being an example, and may be deposited by evaporation, sputtering, or chemical vapor deposition.

Figure 2C:
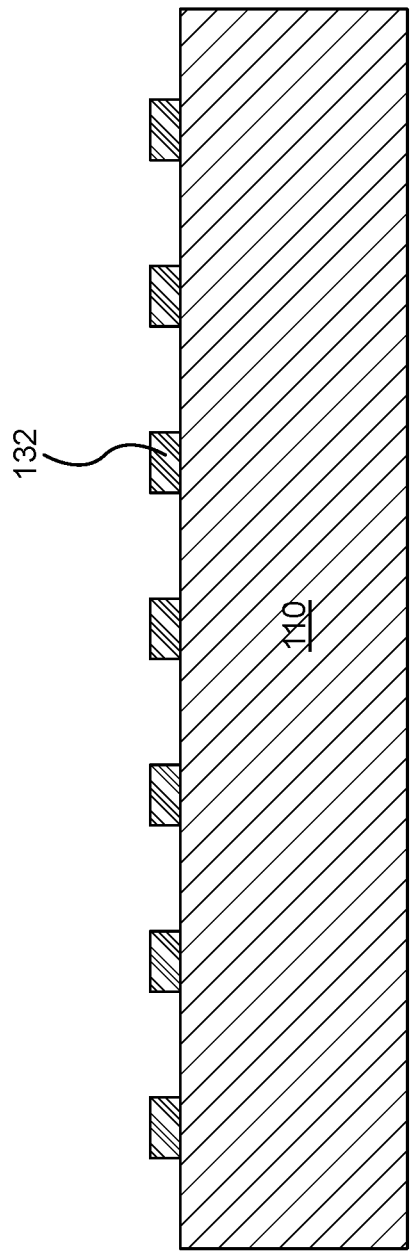
Figure 2D:
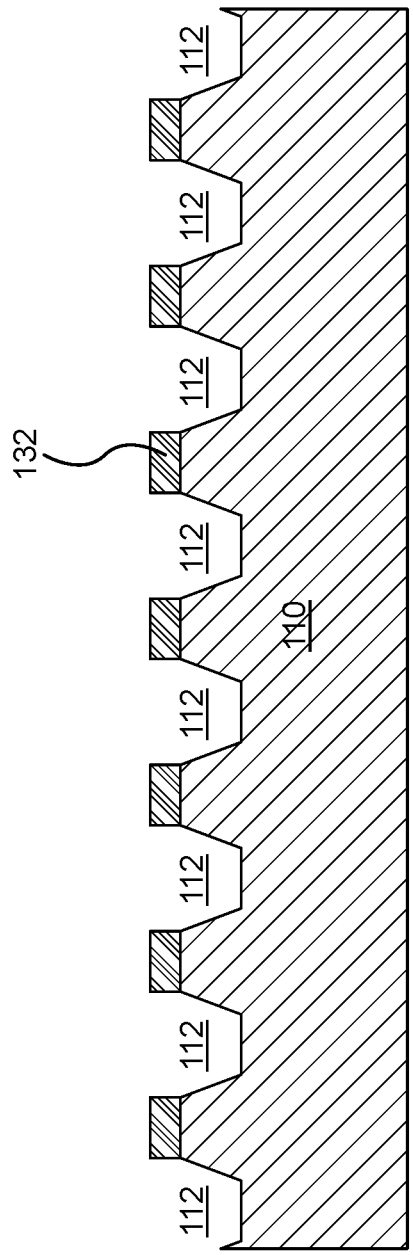

In FIG. 2C, the resist layer 130 is lifted off silicon substrate 110, taking with it the overlying nickel patterns on the column portions of the resist, leaving behind a periodic pattern of nickel protrusions 132 as seen in FIG. 2C. Using the periodic pattern of nickel protrusions as a mask, recesses 112 are etched into the surface of the silicon substrate 110, as seen in FIG. 2D. The recesses 112 are etched until they reach an approximate depth of 300 nm to 1 micron, more particularly, approximately 400 nm to approximately 600 nm. A variety of etching techniques may be used based on the desired shape of the recesses. For example, plasma-based etching such as inductively-coupled plasmas using fluorine-including reactants including, but not limited to, as $CCl_4$, $CF_4$, $SF_6$, $NF_3$, or $CCl_2F_2$, $CHF_3$, XeF, mixtures thereof and mixtures with carrier gases may be used to form the recesses 112.

Alternatively, anisotropic etching techniques such as wet etching may be used to form recesses having angled sidewalls. For examples, an anisotropic etchant such as KOH preferentially etches in the <100> plane producing angled sidewalls. The angle will depend on the selected orientation of the silicon substrate 110.

Figure 2E:
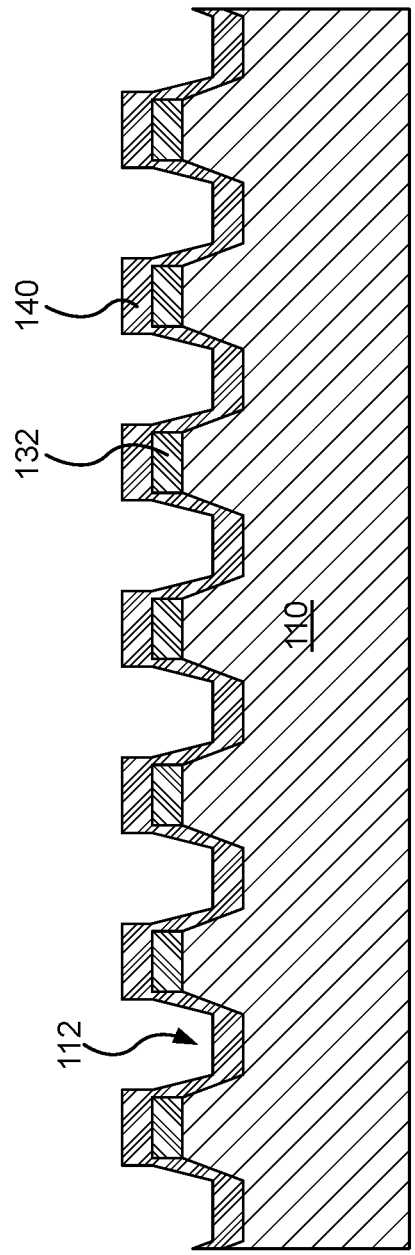

A layer of insulator 140 is deposited over the nickel pattern 132 and the silicon surface recesses 112 in FIG. 2E. The insulator may be selected from a silicon dioxide or $SiO_x$ layer, or a silicon nitride or $SiN_x$, layer, silicon oxynitride, and other oxides or nitrides. In one aspect, the insulator may be silicon dioxide deposited by evaporation, chemical vapor deposition, plasma-enhanced chemical vapor deposition, or sputtering. Precursor gases for CVD include silane, $SiH_4$, dichlorosilane, $SiCl_2H_2$, and tetraethylorthosilicate $Si(OC_2H_5)_4$ optionally mixed with carrier gases and oxygen-containing gases.

Figure 2F:
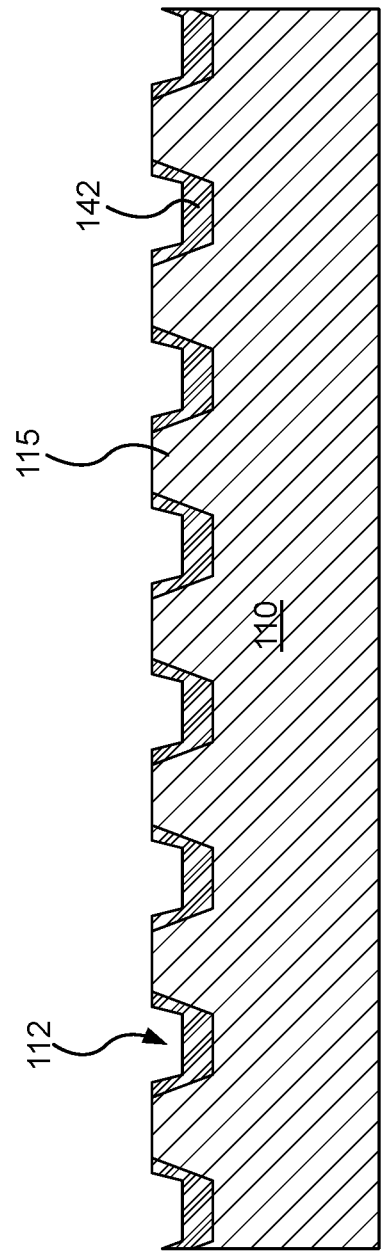
Figure 4:
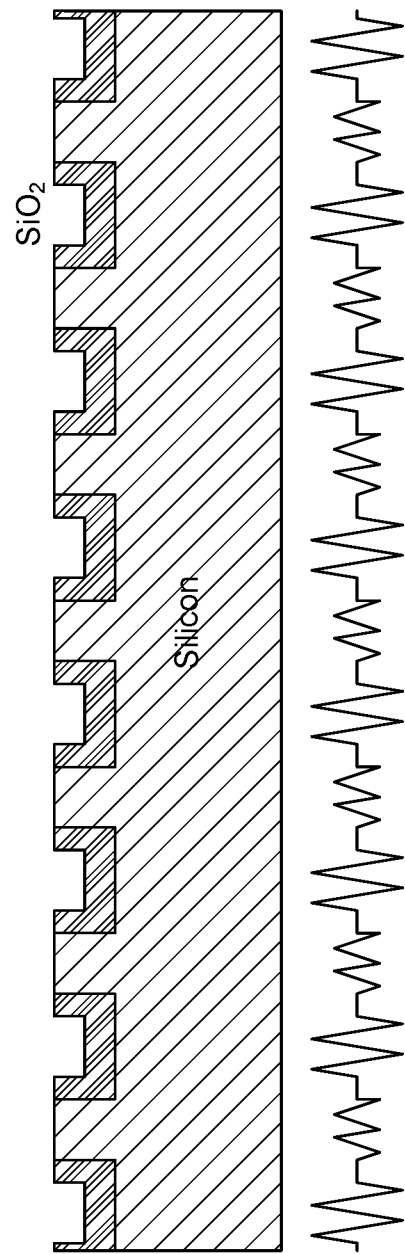
FIG. 4 is a cross-sectional view of patterned silicon substrate showing a periodic change in resistivity across the surface of the substrate.

The nickel mask pattern is removed in FIG. 2F, along with the portions of the insulator layer. The nickel mask may be removed using an acid removal technique, such as with nitric acid. When other metals are used as a mask, etchants are tailored for removal of those other metals. When the nickel mask 132 is removed with the overlying insulator, a discontinuous layer of insulator within recesses 112 is created, leaving regions of silicon surface 115 that are not covered by the discontinuous insulator layer. In this manner, a surface is created having variable resistivity across the surface, as schematically depicted in FIG. 4. The insulator-containing recesses 112 possess high resistivity while the surface silicon regions 115 possess comparatively lower resistivity.

Figure 3A:
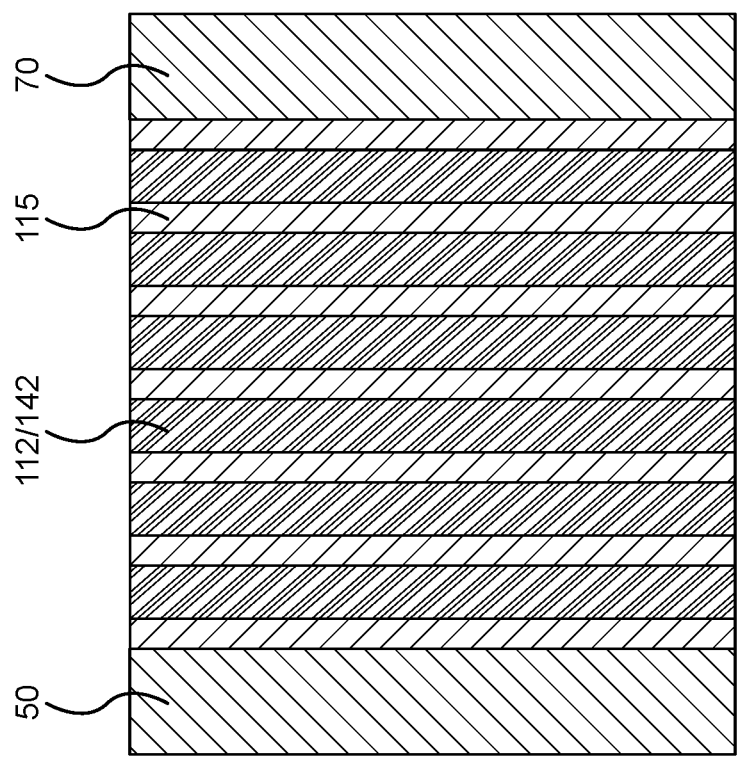
FIGS. 3A-3B are top views of a portion of a III-nitride semiconductor device showing various substrate recess patterns according to further embodiments of the present disclosure.

As seen in FIG. 3A, the recesses 112 with insulator coating 142, may form longitudinal channels across the width of the substrate. The longitudinal channels formed by recesses 112 may be formed throughout the entire surface of the silicon substrate. Alternatively, as seen in FIG. 3A and in FIG. 1A, the recesses may be formed only in a region between the gate 50 and the drain 70 or in both the region between the gate 50 and the drain 70 and a region between the source 60 and the gate 50.

Figure 3B:
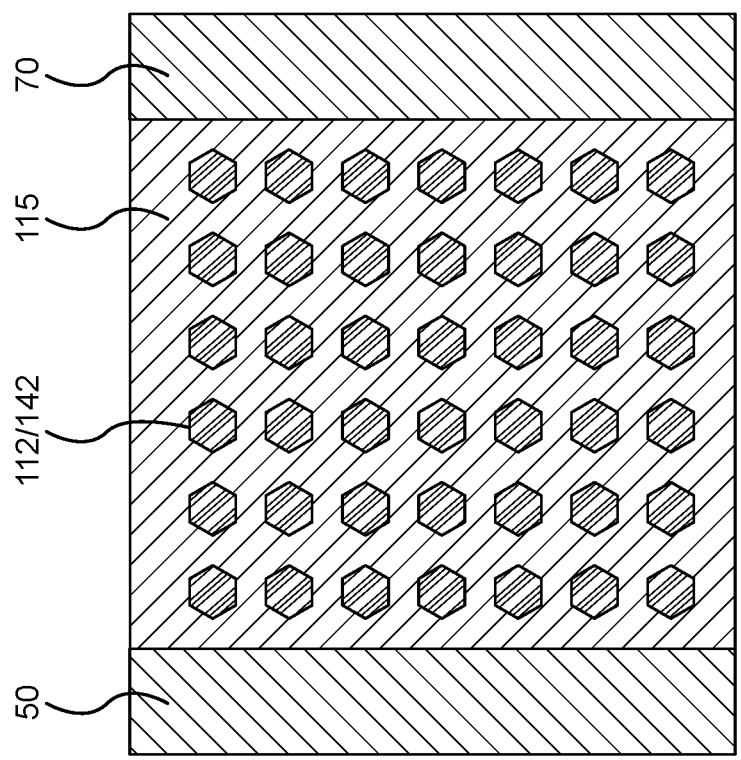

Numerous other recess configurations are possible for use in the semiconductor devices of the present invention. In FIG. 3B, the recesses 112 (with insulator layer 142) are formed with a hexagonal-shaped cross section with a diameter of approximately 200-600 nm, with 400 nm being an example. As with the embodiment of FIG. 3A, the recesses may be formed throughout the substrate or only in the region between the gate 50 and the drain 70 or between the source 60 and drain 50 as well as between the gate 50 and the drain 70. In some aspects, the hexagonal shape of the recesses 112 in FIG. 3B may be sized and positioned to provide stress release as the hexagonal recess shape is similar to the lattice structure of silicon.

As discussed above, substrate loss is an important factor for RF device and there is a parasitic channel at an epitaxial III-nitride/silicon interface. Therefore, the etching of the silicon substrate and deposition of an insulator in the recesses, the parasitic channel is reduced and the effective resistivity of substrate is increased, leading to improved device performance. In addition to improving the electrical characteristics, the patterned substrates of the present invention reduce stress in the subsequently-grown III-nitride epitaxial layer grown over the substrate. This may lead to improved epitaxial III-nitride layer quality includes reduction of dislocation density in the epitaxial layer and improvement in the overall lattice quality of the III-nitride layer.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm, within 20 µm, within 10 µm, or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A III-nitride-based semiconductor device, comprising:
a silicon substrate having a surface;
a periodic array of recesses formed in the surface of the silicon substrate;
a discontinuous insulating layer formed within each recess of the periodic array of recesses such that a portion of the silicon substrate surface between adjacent recesses is free from coverage of the discontinuous insulating layer;
a first III-nitride semiconductor layer formed over the silicon substrate;
a second III-nitride semiconductor layer disposed over the first III-nitride semiconductor layer and having a bandgap greater than a bandgap of the first III-nitride semiconductor layer;
a source and a drain disposed over the second III-nitride semiconductor layer;
a gate disposed over the second III-nitride semiconductor layer and between the source and the drain; and
a buffer layer positioned between the first III-nitride semiconductor layer and the silicon substrate, wherein the buffer layer comprises one or more layers of GaN, GaAs, InN, AlN, InGaN, AlGaN, InAlGaN, or combinations thereof.

2. The III-nitride-based semiconductor device of claim 1, wherein the first III-nitride semiconductor layer is selected from one or more of GaN, AlN, InN, $In_xAl_yGa_{(1-x-y)}N$ where x+y≤1, or $Al_yGa_{(1-y)}N$ where y≤1.

3. The III-nitride-based semiconductor device of claim 1, wherein the second III-nitride semiconductor layer is selected from one or more of GaN, AlN, InN, $In_xAl_yGa_{(1-x-y)}N$ where x+y≤1, or $Al_yGa_{(1-y)}N$ where y≤1.

4. The III-nitride-based semiconductor device of claim 1, wherein the periodic array of recesses is a periodic array of recesses in two dimensions and wherein each recess has an approximately hexagonal shape when viewed in a direction normal to the silicon substrate.

5. The III-nitride-based semiconductor device of claim 4, wherein the periodic array of recesses in two dimensions extends between the gate and the drain such that a portion of the silicon substrate under the gate and a portion of the silicon substrate under the drain is free of recesses.

6. The III-nitride-based semiconductor device of claim 1, wherein the periodic array of recesses is a linear array of trenches that extend along the silicon substrate between at least the gate and the drain such that a portion of the silicon substrate under the gate and a portion of the silicon substrate under the drain is free of trenches.

7. The III-nitride-based semiconductor device of claim 1, further comprising a doped III-nitride semiconductor layer positioned beneath the gate and over the second III-nitride semiconductor layer.

8. The III-nitride-based semiconductor device of claim 7, wherein the doped III-nitride semiconductor layer is a p-doped semiconductor layer.

9. A method of making a III-nitride-based semiconductor device, comprising:
providing a silicon substrate having a surface;
forming a periodic array of recesses formed in the surface of the silicon substrate;
forming a discontinuous insulating layer formed within each recess of the periodic array of recesses such that a portion of the silicon substrate surface between adjacent recesses is free from coverage of the discontinuous insulating layer;
depositing a first III-nitride semiconductor layer over the silicon substrate;
depositing a second III-nitride semiconductor layer over the first III-nitride semiconductor layer, the second III-nitride semiconductor layer having a bandgap greater than a bandgap of the first III-nitride semiconductor layer;
forming a source and a drain over the second III-nitride semiconductor layer;
forming a gate over the second III-nitride semiconductor layer and between the source and the drain;
wherein the method further comprising: forming a buffer layer positioned between the first III-nitride semiconductor layer and the silicon substrate, wherein the buffer layer comprises one or more layers of GaN, GaAs, InN, AlN, InGaN, AlGaN, InAlGaN, or combinations thereof.

10. The method of making the III-nitride-based semiconductor device of claim 9, wherein the forming of the periodic array of recesses includes a process of UV nano-imprinting lithography on the silicon substrate to create a resist-patterned silicon substrate.

11. The method of making the III-nitride-based semiconductor device of claim 10, further comprising depositing a metal layer over the resist-patterned silicon substrate and lifting off the resist to create a metal patterned substrate.

12. The method of making the III-nitride-based semiconductor device of claim 11, further comprising etching the metal patterned substrate to create recesses having a depth of approximately 200-1000 nm.

13. The method of making the III-nitride-based semiconductor device of claim 12, further comprising depositing a blanket insulating layer over the metal patterned and etched silicon substrate.

14. The method of making the III-nitride-based semiconductor device of claim 13, further comprising removing metal pattern and insulating layer portions overlying the metal layer to form the discontinuous insulating layer.

15. The method of making the III-nitride-based semiconductor device of claim 9, wherein the first III-nitride semiconductor layer is selected from one or more of GaN, AlN, InN, $InxAl_yGa_{(1-x-y)}N$ where $x+y \leq 1$, or $Al_yGa_{(1-y)}N$ where $y \leq 1$.

16. The method of making the III-nitride-based semiconductor device of claim 9, wherein the second III-nitride semiconductor layer is selected from one or more of GaN, AlN, InN, $InxAl_yGa_{(1-x-y)}N$ where $x+y \leq 1$, or $Al_yGa_{(1-y)}N$ where $y \leq 1$.

17. A III-nitride-based semiconductor device, comprising:
a silicon substrate having a surface;
a periodic array of recesses formed in the surface of the silicon substrate;
a discontinuous insulating layer formed within each recess of the periodic array of recesses such that a portion of the silicon substrate surface between adjacent recesses is free from coverage of the discontinuous insulating layer;
a first III-nitride semiconductor layer formed over the silicon substrate;
a second III-nitride semiconductor layer disposed over the first III-nitride semiconductor layer and having a bandgap greater than a bandgap of the first III-nitride semiconductor layer;
a source and a drain disposed over the second III-nitride semiconductor layer;
a gate disposed over the second III-nitride semiconductor layer and between the source and the drain; and
a doped III-nitride semiconductor layer positioned beneath the gate and over the second III-nitride semiconductor layer.

\* \* \* \* \*